(12) United States Patent
Fukuda

(10) Patent No.: US 9,589,816 B2
(45) Date of Patent: Mar. 7, 2017

(54) BLANKET, PRINTING PROCESS, AND A METHOD OF MANUFACTURING DISPLAY UNIT AND ELECTRONIC APPARATUS

(71) Applicant: Sony Corporation, Tokyo (JP)

(72) Inventor: Toshio Fukuda, Kanagawa (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/286,230

(22) Filed: May 23, 2014

(65) Prior Publication Data

US 2014/0345484 A1 Nov. 27, 2014

(30) Foreign Application Priority Data

May 24, 2013 (JP) ................. 2013-109772

(51) Int. Cl.
| | | |
|---|---|---|
| B41N 10/04 | (2006.01) | |
| H01L 21/48 | (2006.01) | |
| H01L 51/00 | (2006.01) | |
| H01L 51/56 | (2006.01) | |
| H01L 51/05 | (2006.01) | |

(52) U.S. Cl.
CPC ........ *H01L 21/4846* (2013.01); *H01L 51/003* (2013.01); *H01L 51/0004* (2013.01); *H01L 51/0508* (2013.01); *H01L 51/56* (2013.01)

(58) Field of Classification Search
CPC .... H01L 21/4846; H01L 33/005; B41N 10/04
See application file for complete search history.

(56) References Cited

U.S. PATENT DOCUMENTS

| | | | | |
|---|---|---|---|---|
| 5,366,784 | A * | 11/1994 | Herbison | 428/141 |
| 6,289,809 | B1 * | 9/2001 | Sonobe | 101/401.1 |
| 2002/0170452 | A1 * | 11/2002 | Heinzl | B41C 1/1008 101/463.1 |
| 2003/0226463 | A1 * | 12/2003 | Teng | 101/463.1 |
| 2004/0182270 | A1 * | 9/2004 | Wiedemer | B41C 1/1075 101/465 |
| 2004/0211329 | A1 * | 10/2004 | Funahata et al. | 101/463.1 |
| 2005/0115429 | A1 * | 6/2005 | Link | B41C 1/1008 101/463.1 |
| 2007/0119324 | A1 * | 5/2007 | Yoo et al. | 101/492 |
| 2007/0199461 | A1 * | 8/2007 | Cyman et al. | 101/211 |
| 2008/0011170 | A1 * | 1/2008 | Kim et al. | 101/324 |
| 2008/0020007 | A1 * | 1/2008 | Zang | 424/401 |
| 2011/0132527 | A1 * | 6/2011 | Kook et al. | 156/219 |
| 2011/0284382 | A1 * | 11/2011 | Park et al. | 205/50 |

FOREIGN PATENT DOCUMENTS

| | | |
|---|---|---|
| JP | 2000-289320 | 10/2000 |
| JP | 2003-017261 | 1/2003 |
| JP | 2005-128346 | 5/2005 |
| JP | 2005-175061 | 6/2005 |
| JP | 2007-095517 | 4/2007 |
| JP | 2007-160514 | 6/2007 |

\* cited by examiner

*Primary Examiner* — David Banh
(74) *Attorney, Agent, or Firm* — K&L Gates LLP

(57) ABSTRACT

A blanket includes a releasable base; and a sacrificial layer being provided on the base and separated from the base in printing.

6 Claims, 15 Drawing Sheets

<SACRIFICIAL LAYER FORMATION STEP>

\<INK LAYER APPLICATION STEP\>

<PRINTING PATTERN FORMATION STEP>

<TRANSFER STEP>

BLANKET, PRINTING PROCESS, AND A METHOD OF MANUFACTURING DISPLAY UNIT AND ELECTRONIC APPARATUS

CROSS REFERENCES TO RELATED APPLICATIONS

The present application claims priority to Japanese Priority Patent Application JP 2013-109772 filed in the Japan Patent Office on May 24, 2013, the entire content of which is hereby incorporated by reference.

BACKGROUND

The present disclosure relates to a blanket to be used in formation of a layer to be patterned such as, for example, an organic layer of an organic electro luminescence (EL) display unit, a printing process using the blanket, and a method of manufacturing each of a display unit and an electronic apparatus.

Recently, reduction in material usage and size reduction and simplification of manufacturing equipment have been considered in response to demands for cost reduction and area increase of an electronic apparatus. Pattern formation of various functional electronic materials (for example, a conductor, a phosphor, a dielectric, and the like) using various printing processes is therefore noticed. Examples of the printing processes may include spin coating, a discharge-type printing process such as inkjet printing, flexo printing, and plate printing such as reverse offset printing.

In the plate printing, for example, an ink coating (ink layer) is formed on an intermediate transfer body called blanket. Subsequently, the ink layer is made into contact with a letterpress plate, and a pattern left on the blanket is transferred from the blanket to a printing substrate to perform printing (for example, see Japanese Unexamined Patent Application Publication No. 2000-289320).

However, since the blanket is formed of silicone rubber or the like, its wettability is low; hence, the ink layer easily becomes uneven in thickness. To cope with this, a method of forming a uniform ink layer without unevenness in thickness has been disclosed, in which an organic solvent is used as a solvent of an ink solution, the organic solvent having a surface free energy lower than a coated surface of a blanket, i.e., silicone rubber, or a surfactant is added to form such a uniform ink layer (for example, see Japanese Unexamined Patent Application Publication Nos. 2003-17261, 2005-175061, and 2005-128346).

A soft material such as silicone rubber easily absorbs an organic solvent. Hence, the ink layer applied on the blanket is easily dried into a film, thereby pattern accuracy is reduced, or patterning becomes difficult. To cope with this, for example, a method of preventing drying of the ink layer has been disclosed, in which a blanket is beforehand immersed in a predetermined organic solvent so as to be swollen before ink is applied onto the blanket (for example, see Japanese Unexamined Patent Application Publication No. 2007-160514). Alternatively, a method of forming an ink layer has been disclosed, in which an ink-coated surface of a blanket is plasma-treated so as to be hydrophilic, and an aqueous ink that is less absorbable by the silicone rubber is used to form the ink layer (for example, see Japanese Unexamined Patent Application Publication No. 2007-95517).

SUMMARY

However, the blanket is necessary to be swollen while being controlled in swollen amount. In addition, since a large amount of organic solvent is used, cost is increased, and it is difficult to meet large area. Furthermore, repeated swelling accelerates degradation in silicone rubber, and blanket life is reduced. Moreover, when the coated surface of the blanket is plasma-treated, while wettability is improved, separability is degraded, and the residue is caused. Furthermore, since the plasma treatment is to modify (alter) the surface of the blanket, degradation in blanket is accelerated as in the case of swelling.

It is desirable to provide a blanket and a printing process, each of which increases the degree of freedom of selection of a solvent to be used for an ink solution and achieves high-quality patterning, and a method of manufacturing each of a display unit and an electronic apparatus.

According to an embodiment of the present technology, there is provided a blanket, including: a releasable base; and a sacrificial layer being provided on the base and separated from the base in printing.

According to an embodiment of the present technology, there is provided a printing process, including: forming a functional ink layer on a blanket having a sacrificial layer on a releasable base, the sacrificial layer being separated from the base in printing; pressing a removal plate having a convex portion having a predetermined pattern to the ink layer to form a pattern layer on the blanket; and transferring the pattern layer to a printing substrate.

According to an embodiment of the present technology, there is provided a method of manufacturing a display unit, the method including forming a display device, the forming of the display device including: forming a functional ink layer on a blanket having a sacrificial layer on a releasable base, the sacrificial layer being separated from the base in printing; pressing a removal plate having a convex portion having a predetermined pattern to the ink layer to form a pattern layer on the blanket; and transferring the pattern layer to a printing substrate.

According to an embodiment of the present technology, there is provided a method of manufacturing an electronic apparatus, the method including forming a display unit, the forming of the display unit including: forming a functional ink layer on a blanket having a sacrificial layer on a releasable base, the sacrificial layer being separated from the base in printing; pressing a removal plate having a convex portion having a predetermined pattern to the ink layer to form a pattern layer on the blanket; and transferring the pattern layer to a printing substrate.

In the blanket, the printing process, the method of manufacturing each of the display unit and the electronic apparatus according to the above-described respective embodiments of the present technology, the blanket having the sacrificial layer is formed on the base, the sacrificial layer being separated from the base together with the ink layer in printing, and printing is performed using the blanket, which makes it possible to transfer the ink layer to the printing substrate without optimization of an ink solution, etc.

According to the blanket, the printing process, the method of manufacturing each of the display unit and the electronic apparatus of the above-described respective embodiments of the present technology, a blanket, which includes a sacrificial layer provided on a base, is formed, the sacrificial layer being separated from the base together with the ink layer in printing, and printing is performed using the blanket. This increases the degree of freedom of selection of a solvent to be used for an ink solution, and achieves high-quality patterning.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, an embodiment of the present technology will be described in detail with reference to the accompanying drawings. It is to be noted that description is made in the following order.

1. Embodiment
1-1 Blanket
1-2 Manufacturing Method
1-3 Configuration of Display Unit
1-4 Functions and Operation
2. Modification
3. Example
4. Application Examples

[1. Embodiment]

(1-1 Blanket)

Figure 1:
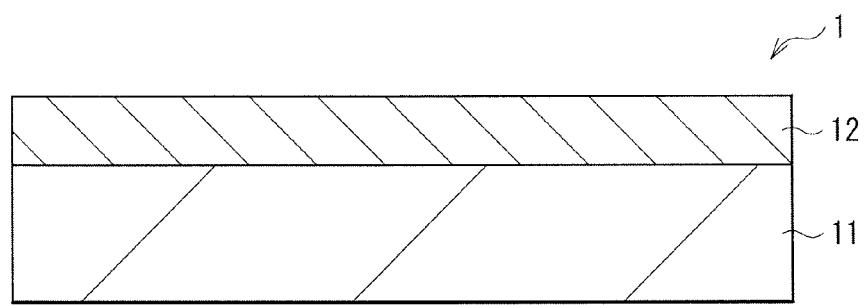
FIG. 1 is a cross-sectional diagram illustrating a configuration of a blanket according to an example embodiment of the present disclosure.

FIG. 1 illustrates a sectional configuration of a blanket (blanket 1) according to an embodiment of the present disclosure. The blanket 1 is used for formation, by plate printing, of each of layers configuring a thin film transistor (TFT) provided in a semiconductor layer 20 of an organic EL display unit (for example, a display unit 5A, see FIG. 9), or formation of a light emitting layer 33C emitting light of one of red (R), green (G), and blue (B). In the plate printing, for example, reverse offset printing, an ink layer A is formed on the blanket 1, and then the ink layer A is made into contact with a removal plate 2 (reverse printing plate), and a pattern (a streak section A') left on the blanket 1 is contact-transferred from the blanket 1 to a printing substrate (substrate 3) to perform printing (see FIGS. 3 to 5). In this embodiment, a configuration of the blanket 1 used in the plate printing is described in detail.

The blanket 1 has a configuration in which a sacrificial layer 12 configured of a material that is insoluble in a solvent used for an ink solution (a solution D2r), in which a functional material configuring an ink layer A is dissolved, is stacked on a releasable base 11.

The base 11 may be formed of a releasable material, for example, a material having low surface tension, and may preferably be formed of, for example, a silicone-based material. Specific examples of the silicone-based material include silicon resin such as thermosetting millable silicone rubber, addition-type liquid silicone rubber, and condensation curing liquid silicone rubber. Since the sacrificial layer 12 and the ink layer A are applied onto the base 11, a silicone resin that is curable by means of UV cross-linking or thermal cross-linking is particularly preferably used.

The sacrificial layer 12 is configured of a material having a higher wettability than the base 11, and facilitates application of the ink layer A. Although it is possible to appropriately set the thickness of the sacrificial layer 12 depending on applications thereof, the thickness may be 0.1 μm to 10 μm, both inclusive, for example. A material configuring the sacrificial layer 12 is selected from materials that are each insoluble in the solvent of the ink solution (solution D2r) as described above since the ink layer A is formed on the surface of the sacrificial layer 12. Specifically, a solvent of a solution (solution D1r) forming the sacrificial layer 12 is selected, the solvent having a solubility parameter (SP value) that is different from a solubility parameter of the solvent of the ink solution (solution D2r) preferably by two or more, more preferably by three or more, and most preferably by four or more.

For example, in the case where the solvent of the ink solution is water, examples of the material used as the sacrificial layer 12 may preferably include a material that is soluble in an aromatic solvent such as toluene or other organic solvents. Specific examples of the resin soluble in toluene may include polystyrene, polyester, and the like. In the case where the solvent of the ink solution is an aromatic solvent such as toluene, xylene, or mesitylene, the sacrificial layer 12 is preferably formed of a material that is soluble in water or an alcohol series solvent. Specific examples of the resin soluble in water may include polyvinyl alcohol and celluloses such as ethyl cellulose. Specific examples of the resin soluble in the alcohol series solvent may include polyvinyl butyral, polyamide, and the like. Table 1 collectively shows an example of combinations of materials of the sacrificial layer 12 and the ink layer A, and SP values of the materials and differences between the SP values. It is to be noted that several types of solvents may be used in combination for each of the sacrificial layer 12 and the ink layer A.

TABLE 1

| Sacrificial layer | SP value | Ink layer | SP value | Difference |
|---|---|---|---|---|
| Ethylalcohol | 12.7 | Xylene | 8.8 | 3.9 |
| Isopropyl alcohol | 11.5 | Cyclohexane | 8.2 | 3.3 |
| Toluene | 8.9 | Water | 23.4 | 14.5 |
| Isopropyl alcohol | 11.5 | Anisole | 9.3 | 2.2 |

(1-2. Manufacturing Method)

Figure 2A:
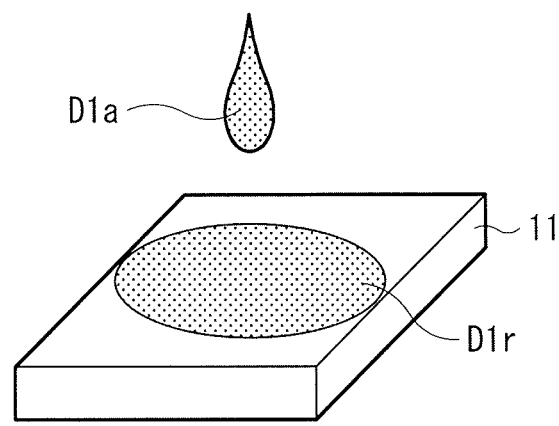
FIGS. 2A to 2C are process drawings explaining a flow of a printing process using the blanket illustrated in FIG. 1.
Figure 2B:
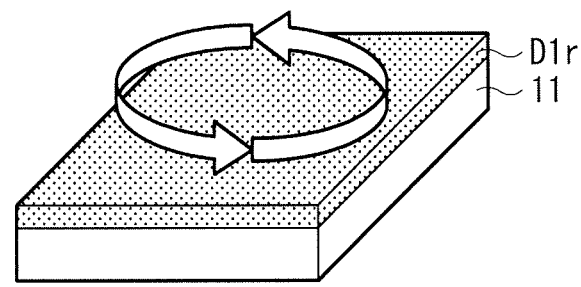
Figure 2C:
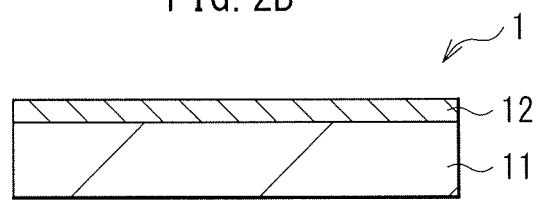

FIGS. 2A to 5C illustrate a process of the reverse offset printing. First, as illustrated in FIGS. 2A to 2C, the sacrificial layer 12 is formed on the base 11 to prepare the blanket 1. For example, as illustrated in FIG. 2A, the solution D1r is discharged onto the base 11 configured of silicone rubber. Subsequently, as illustrated in FIG. 2B, the solution D1r is spread over the surface of the base 11 by bar coating, die coating, or spin coating. Subsequently, the solution D1r is dried to produce the blanket 1 having the sacrificial layer 12 on the base 11 as illustrated in FIG. 2C.

Figure 3A:
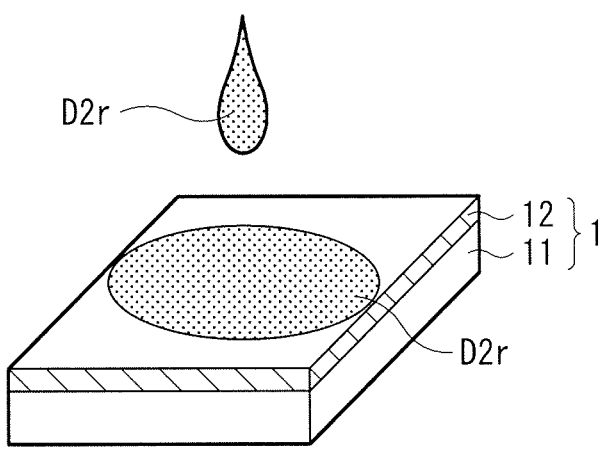
FIGS. 3A to 3C are process drawings following FIG. 2C.
Figure 3B:
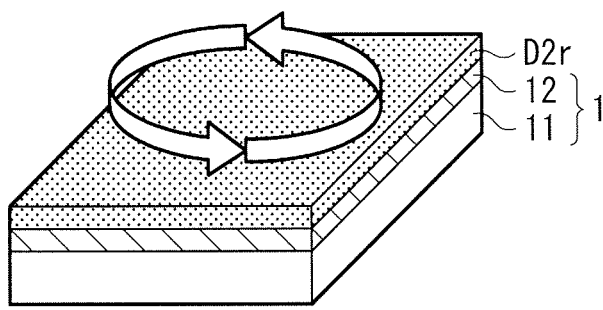
Figure 3C:
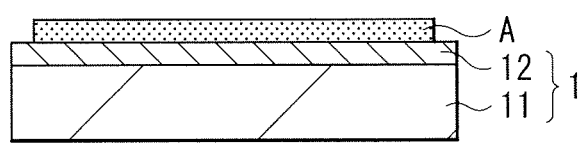

Subsequently, as illustrated in FIG. 3A, the solution D2r, in which a functional material is dissolved, is discharged onto the sacrificial layer 12 of the blanket 1. As illustrated in FIG. 3B, the solution D2r is spread over the sacrificial layer 12 by bar coating, die coating, or spin coating and then dried, thereby the ink layer A configured of the functional material is formed on the sacrificial layer 12 as illustrated in FIG. 3C.

Figure 4A:
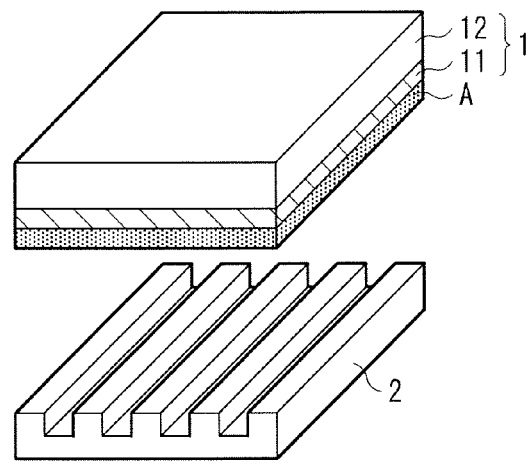
FIGS. 4A to 4C are process drawings following FIG. 3C.
Figure 4B:
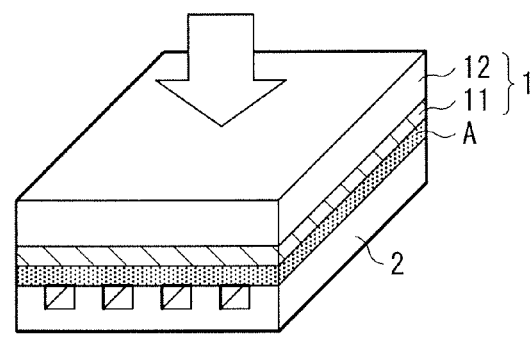

Subsequently, as illustrated in FIG. 4A, a removal plate 2 having a convex portion having a predetermined pattern (a reverse pattern (unstreak section) of a desired pattern) is pressed to the blanket 1 having the ink layer A thereon. In this step, in the case of a small substrate, for example, the blanket 1 and the removal plate 2 may be disposed so as to be parallel to each other, and pressure is collectively applied to the entire back face of the blanket 1, thereby contact is evenly made. In the case of a large substrate, for example, the blanket 1 is slightly slantly disposed on the removal plate 2, and is then superposed thereon while being gradually contacted from an end of the blanket 1. Subsequently, pressure is applied from the back side of the blanket 1 by a roller or the like as necessary.

Figure 4C:
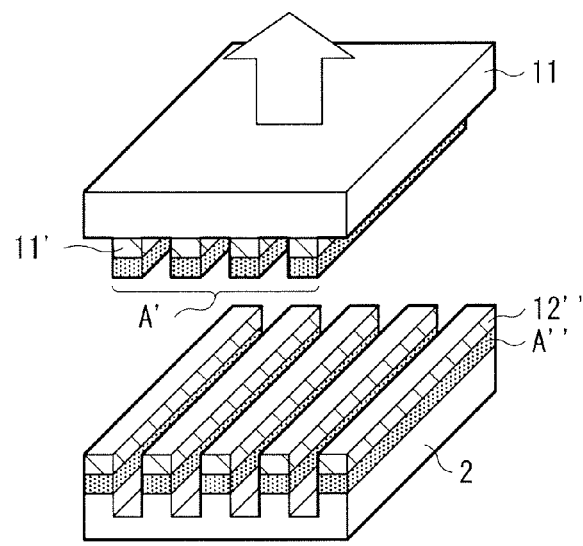

The removal plate 2 may be any plate capable of removing the unstreak section of the ink layer A from the blanket 1, and may be configured of, for example, an inorganic material such as glass and silicone, metal such as stainless steel, copper (Cu), and nickel (Ni), or any of various resist materials. The removal plate 2 has a concave portion having a pattern corresponding to an objective print. The removal plate 2 is made into contact with the blanket 1 such that the concave portion of the removal plate 2 is opposed to the ink layer A, thereby, as illustrated in FIG. 4C, a streak section A' configured of a functional material having the same pattern as the pattern of the concave portion of the removal plate 2 is formed on the blanket 1. An unstreak section A″ configured of a functional material having a pattern reverse to the pattern of the concave portion (the same pattern as that of the convex portion) is formed on the removal plate 2.

Since the sacrificial layer 12 and the ink layer A are necessary to be separated from the surface of the base 11, the irregular surface of the removal plate 2 is preferably formed of a material that is more wettable than the base 11, or is preferably surface-treated. For example, the irregularity on the removal plate 2 may be formed by a technique of sandblast, photolithography and etching, focused ion beam (FBI), or the like. Furthermore, the removal plate 2 is preferably made into contact with the blanket 1 within a short time, for example, 1 min, after formation of the ink layer A on the blanket 1. This is because if a considerably long time has elapsed, the solvent contained in the ink layer A volatilizes, and the ink layer A is excessively dried.

Figure 5A:
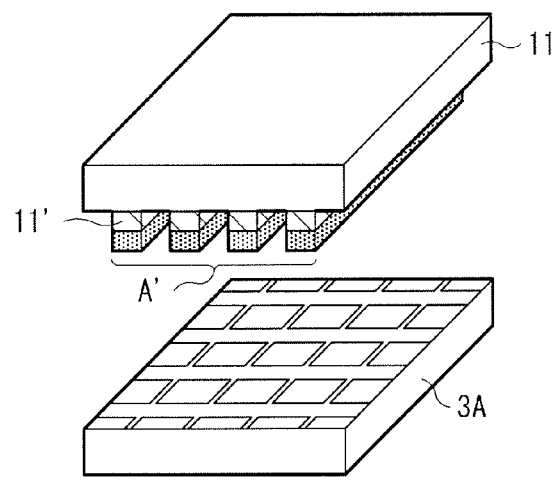
FIGS. 5A to 5C are process drawings following FIG. 4C.
Figure 5B:
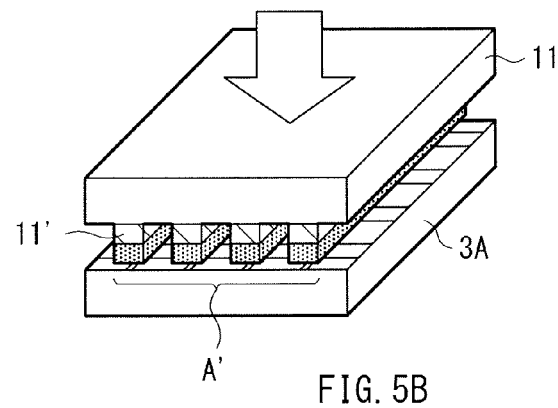
Figure 5C:
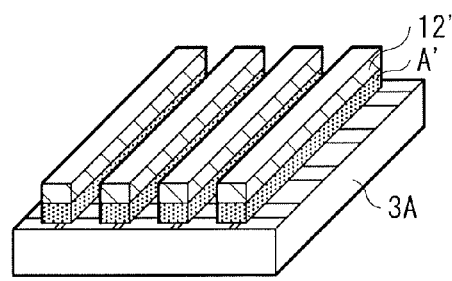

Subsequently, as illustrated in FIG. 5A, a substrate 3A to be a printing substrate is prepared, and the streak section A' of the blanket 1 and a pattern formation position of the substrate 3A are aligned to be opposed to each other. Subsequently, as illustrated in FIG. 5B, the blanket 1 is pressed to the substrate 3A by, for example, the above-described pressurizing method, and then the blanket 1 is detached from the substrate 3A as illustrated in FIG. 5C. Consequently, the streak section A' is printed together with the sacrificial layer 12' onto the substrate 3A. The contact between the blanket 1 and the substrate 3A may be preferably performed, for example, within 30 min after formation of the streak section A'. This is because if a considerably long time has elapsed, the solvent of the solution D2r volatilizes, so that the streak section A' is difficult to be transferred (separated) from the blanket 1.

Finally, the substrate 3A having the sacrificial layer 12' on the streak section A' is immersed in a predetermined solvent to solubly remove the sacrificial layer 12' from the surface of the streak section A', thereby the substrate 3A, on which the streak section A' having a desired pattern is provided, is produced. The solvent used for removing the sacrificial layer 12' dissolves only a material configuring the sacrificial layer 12 while not dissolving a material configuring the streak section A'.

(1-3 Configuration of Display Unit)

Figure 6:
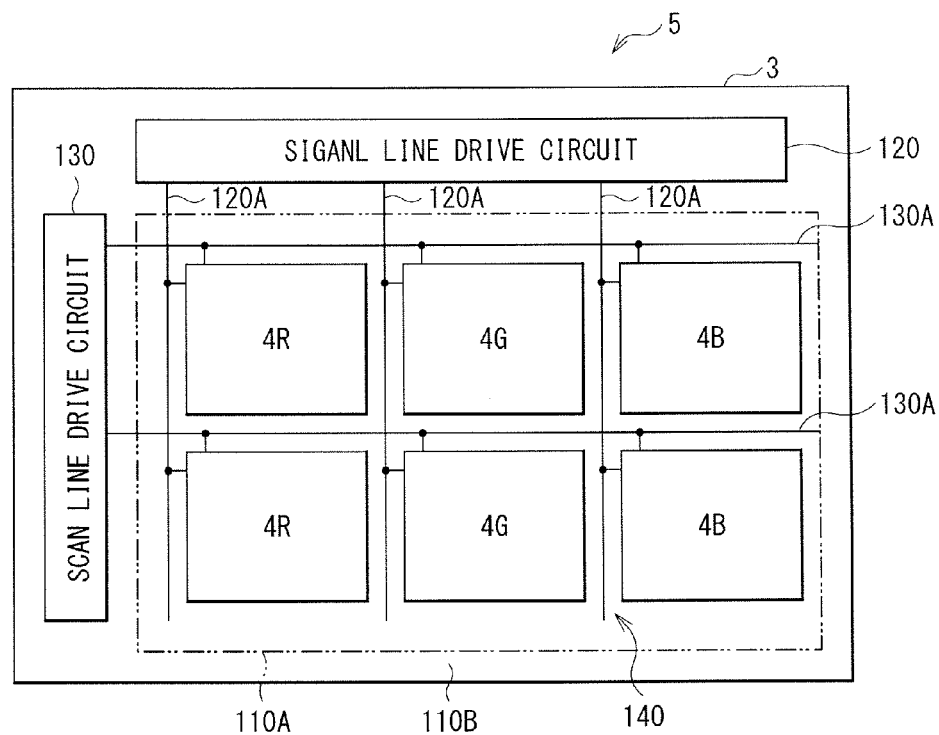
FIG. 6 is a plan diagram illustrating an overall configuration of a display unit according to an example embodiment of the present disclosure.

FIG. 6 illustrates an exemplary planar configuration of a display unit (display unit 5) according to an example embodiment of the present disclosure. The display unit 5 may be used for, for example, a monitor for inspection, and may have a configuration where a plurality of pixels (red pixels 4R, green pixels 4G, and blue pixels 4B) are arranged, for example, in a matrix in a display region 110A. For example, a pixel section 4 may have red light emitting elements 10R (the red pixels 4R), green light emitting elements 10G (the green pixels 4G), and blue light emitting elements 10B (the blue pixels 4B). The light emitting elements 10R, 10G, and 10B may each be configured of not only the organic EL device, but also, for example, an inorganic EL device, a semiconductor laser, a light emitting diode (LED), or the like. A signal line drive circuit 120 and a scan line drive circuit 130, each being a driver for image display, are provided in the periphery (a peripheral region 110B) of the display region 110A.

Figure 7:
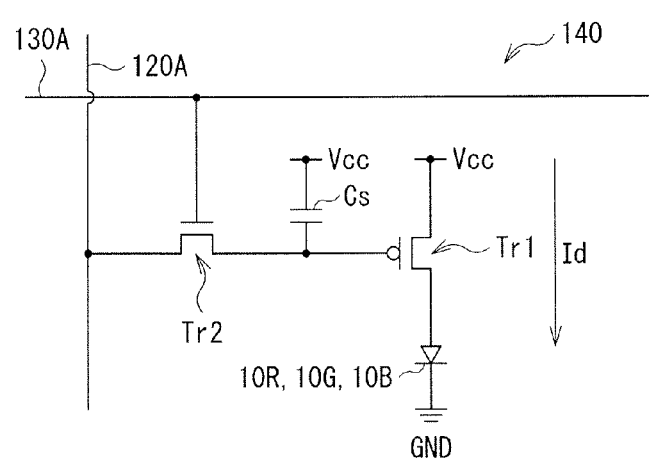
FIG. 7 is a circuit diagram illustrating an example of a pixel drive circuit illustrated in FIG. 6.

A pixel drive circuit 140 is provided in the display region 110A. FIG. 7 illustrates an example of the pixel drive circuit 140. The pixel drive circuit 140 is an active drive circuit provided in an underlayer of a lower electrode 31 described later. Specifically, the pixel drive circuit 140 includes a drive transistor Tr1, a write transistor Tr2, a capacitor (holding capacitance) Cs between the transistors Tr1 and Tr2, and a light emitting element 10R (10G or 10B) connected in series to the drive transistor Tr1 between a first power line (Vcc) and a second power line (GND). The drive transistor Tr1 and the write transistor Tr2 are each configured of a typical thin film transistor, and may have an inversely-staggered structure (so-called bottom gate type; a structure where a gate electrode, a channel layer, and a pair of source and drain electrodes are stacked in this order) or a staggered structure (top gate type; a structure where a channel layer, a gate electrode, and a pair of source and drain electrodes are stacked in this order) without limitation.

In the pixel drive circuit 140, a plurality of signal lines 120A are disposed in a column direction, and a plurality of scan lines 130 are disposed in a row direction. An intersection of each signal line 120A and each scan line 130A corresponds to one of the light emitting elements 10R, 10G, and 10B. Each signal line 120A is connected to the signal line drive circuit 120, and an image signal is supplied from the signal line drive circuit 120 to the source electrode of the write transistor Tr2 through the signal line 120A. Each scan line 130A is connected to the scan line drive circuit 130, and a scan signal is sequentially supplied from the scan line drive circuit 130 to the gate electrode of the write transistor Tr2 through the scan line 130A.

Figure 8:
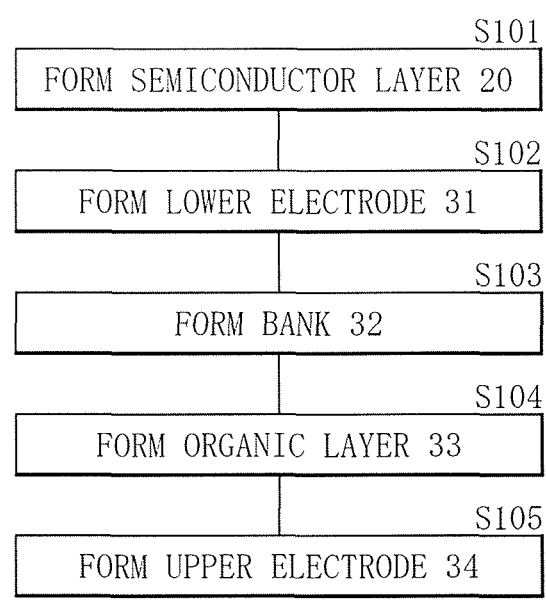
FIG. 8 is a flowchart of a method of manufacturing the display unit illustrated in FIG. 6.
Figure 9:
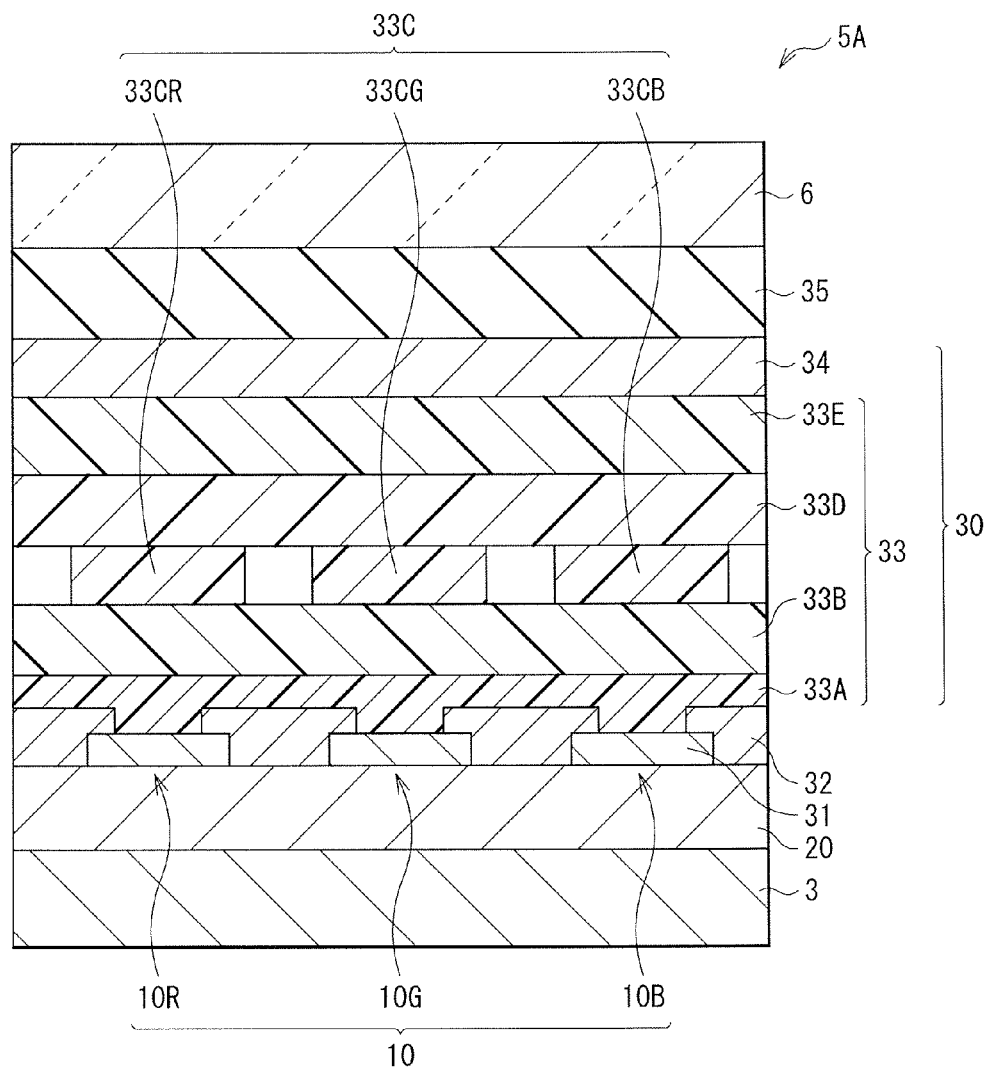
FIG. 9 is a cross-sectional diagram illustrating an exemplary configuration of the display unit illustrated in FIG. 6.

FIG. 8 is a flowchart illustrating a method of manufacturing the display unit 5 illustrated in FIG. 6. FIG. 9 illustrates an exemplary sectional configuration of the display unit 5 (display unit 5A) produced by this manufacturing method. In the display unit 5A, the semiconductor layer 20 and the display layer 30 are stacked in this order on the substrate 3. The semiconductor layer 20 may include, for example, the drive transistor Tr1, the write transistor Tr2, and the like. The display layer 30 may be provided on the semiconductor layer 20, and may include the light emitting element 10. In the display unit 5 (5A), layers of the transistor provided in the semiconductor layer 20, and the light emitting layers 33C (the red light emitting layer 33CR, the green light emitting layer 33CG, and the blue light emitting layer 33CB) of the light emitting element 10 (10R, 10G, and 10B) are formed by the reverse offset printing illustrated in FIG. 2A to FIG. 5C. An example of forming the light emitting layer 33C using the blanket 1 is now described.

(Step of Forming Semiconductor Layer 20)

First, the semiconductor layer 20, which is configured of a gate electrode, a gate insulating film, a channel layer, a pair of source and drain electrodes, all of which are not shown, is formed over the entire surface of the substrate 3 by, for example, a sputtering process or a vacuum evaporation process (step S101). Specifically, a metal film to be the gate electrode is formed, and then the gate electrode is formed through patterning of the metal film by, for example, a photolithography process and etching.

Subsequently, the gate insulating film and the channel layer are formed in order over the entire surface of each of the substrate 3 and the gate electrode. Specifically, a silicon oxide film is formed over the entire surface of the substrate 3 by, for example, a plasma chemical vapor deposition (PECVD) process to produce the gate insulating film. The gate insulating film may be formed by a sputtering process. Subsequently, the channel layer configured of, for example, amorphous silicon is formed on the gate insulating film. The channel layer is formed through film formation of amorphous silicon on the gate insulating film by, for example, direct current (DC) sputtering process. Subsequently, the channel layer is patterned by photolithography and etching.

Subsequently, a pair of source and drain electrodes are formed on the channel layer. Specifically, a metal film such as Cu is formed by, for example, a sputtering process, and then a pair of source and drain electrodes are formed so as to have predetermined patterning forms by etching with a photolithography process. Consequently, a thin film transistor (for example, the drive transistor Tr1) configuring the pixel drive circuit 140 is completed.

(Step of Forming Lower Electrode)

Subsequently, for example, a transparent conductive film configured of, for example, indium tin oxide (ITO) is formed over the entire surface of the substrate 3 on which the semiconductor layer 20 such as the pixel drive circuit is formed, and the transparent conductive film is patterned so that the lower electrode 31 is provided for each of the red light emitting element 10R, the green light emitting element 10G, and the blue light emitting element 10B (step S102). At this time, the lower electrode 31 is connected to the drive transistor of the pixel drive circuit. Although the substrate 3 may be formed of a known material such as, for example, quartz, glass, a metal foil, a resin film, and a resin sheet, the substrate 3 is preferably formed of quartz or glass. The lower electrode 31 may be formed of a single metal element such as chromium (Cr), gold (Au), platinum (Pt), Ni, Cu, tungsten (W), and silver (Ag), or any alloy thereof, or may be formed of a transparent conductive film of indium zinc oxide (InZnO), an alloy of zinc oxide (ZnO) and aluminum (Al), or the like.

(Step of Forming Bank)

Subsequently, for example, an inorganic insulating film such as $SiO_2$ is formed on each of the lower electrode 31 and the substrate 3 by, for example, a chemical vapor deposition (CVD) process, and is patterned by a photolithography technique and an etching technique, thereby a bank 32 is formed (step S103). The bank 32 secures insulation between the lower electrode 31 and an upper electrode 34, and defines a light emitting region into a desired shape; hence, an opening is provided in correspondence to a light emitting region. After the bank 32 is formed, a surface (on a side where the bank 32 and the lower electrode 31 are formed) is subjected to oxygen plasma treatment, so that the surface of the lower electrode 31 is cleaned.

(Step of Forming Organic Layer)

Subsequently, an organic layer 33 is formed on the lower electrode 31 and the bank 32 by stacking a hole injection layer 33A, a hole transport layer 33B, a light emitting layer 33C, an electron transport layer 33D, and an electron injection layer 33E in this order (step S104).

First, for example, the following materials may be used for each of the hole injection layer 33A and the hole transport layer 33B, as described in detail later. Examples of the material to be used for the hole injection layer 33A may include conductive polymers such as polyaniline, polythiophene, polypyrrole, polythienylenevinylene, polythienylene vinylene, polyquinoline, poly-quinoxaline, and derivatives thereof; a polymer including an aromatic amine structure in its principal or side chain; metal phthalocyanine (copper phthalocyanine); and carbon. In addition, oligoaniline or polydioxythiophene such as poly(3,4-ethylenedioxy thiophene) (PEDOT) may be used. In addition, Nafion (trademark) and Liquion (trademark) available from H. C. Starck, "ELsource" (trademark) available from Nissan Chemical Industries, Ltd, and a conductive polymer "Verazol" available from Soken Chemical & Engineering Co., Ltd may be used.

Examples of the material to be used for the hole transport layer 33B may include a polymer material such as polyvinyl carbazole, polyfluorene, polyaniline, polysilane, a polysiloxane derivative including an aromatic amine in its side or principal chain, polythiophene and its derivatives, and polypyrrole.

After the hole transport layer 33B is formed, the red light emitting layer 33CR of the red light emitting element 10R, the green light emitting layer 33CG of the green light emitting element 10G, and the blue light emitting layer 33CB of the blue light emitting element 10B are formed by reverse offset printing.

Specifically, the red light emitting layer 33CR (the green light emitting layer 33CG, or the blue light emitting layer 33CB) is formed by the above-described reverse offset printing (FIGS. 2A to 5C). First, as illustrated in FIGS. 2A to 2C, the blanket 1 having the sacrificial layer 12 is prepared on the base 11. Subsequently, as illustrated in FIG. 3A, the solution D2r in which a functional material is dissolved (for example, a solution for the red light emitting layer 33CR) is discharged onto the sacrificial layer 12 of the blanket 1, and then, as illustrated in FIG. 3B, the solution D2r is spread by spin coating to form the ink layer A configured of the solution D2r as illustrated in FIG. 3C. If the red light emitting layer 33CR, the green light emitting layer 33CG, and the blue light emitting layer 33CB are formed in air, emission life of each of the light emitting elements 10R, 10G, and 10B may be reduced; hence, printing is preferably performed under nitrogen atmosphere.

Thus, an ink layer A configured of the solution D2r for the red light emitting layer 33CR is formed on the blanket 1, and then the removal plate 2 is pressed to the ink layer A as illustrated in FIG. 4A.

As described above, the removal plate 2 has irregularity on one surface thereof. In this case, the removal plate 2 has a concave portion corresponding to a desired pattern (for example, the red light emitting layer 33CR). The removal plate 2 is made into contact with the blanket 1 (FIG. 4B) such that the concave portion of the removal plate 2 is opposed to the ink layer A, thereby, as illustrated in FIG. 4C, the unstreak section A" of the ink layer A is transferred together with the sacrificial layer 12" to the convex portion of the removal plate 2, and a streak section A' having the same pattern as the pattern of the concave portion of the removal plate 2 is formed on the blanket 1.

Subsequently, as illustrated in FIG. 5A, the substrate 3 having up to the hole transport layer 33B is prepared, and the streak section A' and the hole transport layer 33B re aligned to be opposed to each other. In this case, the streak section A' of the blanket 1 is adjusted to a position corresponding to the red light emitting element 10R. Subsequently, as illustrated in FIG. 5B, the blanket 1 is pressed to the substrate 3A, and then the blanket 1 is detached from the substrate 3 as illustrated in FIG. 5C. As a result, the streak section A' to be the red light emitting layer 33CR is printed together with the sacrificial layer 12' on the hole transport layer 33B. The substrate 3 is heated to completely remove the solvent from the streak section A'. Subsequently, the substrate 3 is immersed in a solvent that exclusively dissolves the material configuring the sacrificial layer 12'. Consequently, the sacrificial layer 12' on the streak section A' is removed, and the red light emitting layer 33CR is formed. Subsequently, the green light emitting layer 33CG and the blue light emitting layer 33CB are each formed through similar steps using a new blanket 1.

The functional material as a solute of the solution D2r configures the red light emitting layer 33CR, the green light emitting layer 33CG, and the blue light emitting layer 33CB, and generates light through recombination of electrons and holes upon application of an electric field. Examples of the functional material may include a polyfluorene-series polymer derivative, a (poly) paraphenylene vinylene derivative, a polyphenylene derivative, a polyvinyl carbazole derivative, a polythiophene derivative, a perylene-based dye, a coumarin-based dye, and a rhodamine-based dye. The above-described polymers may be each doped with an organic EL material. Examples of the doping material to be used may include rubrene, perylene, 9,10-diphenyl anthracene, tetraphenyl butadiene, Nile red, and coumarin 6.

The solution D2r may include a low molecular material in addition to the polymer materials as described above. Use of the low molecular material makes it possible to form the red light emitting layer 33CR, the green light emitting layer 33CG, and the blue light emitting layer 33CB on the substrate 3 in high definition on the substrate 3, and improve resolution of the display unit 5.

Figure 10:
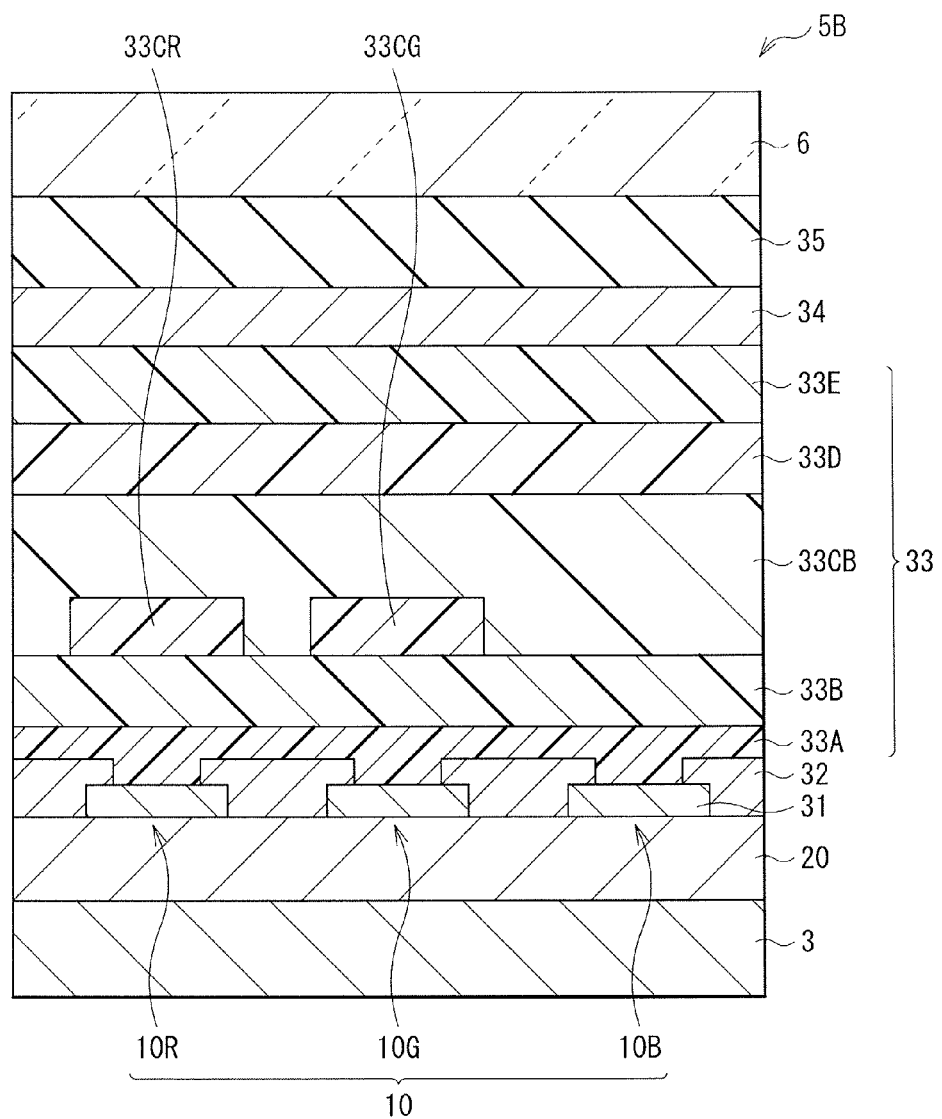
FIG. 10 is a cross-sectional diagram illustrating another exemplary configuration of the display unit illustrated in FIG. 6.

As with a display unit 5B illustrated in FIG. 10, the blue light emitting layer 33CB may be formed as a layer common to the light emitting elements 10R, 10G, and 10B. In such a case, after the red light emitting layer 33CR and the green light emitting layer 33CG are formed, the blue light emitting layer 33CB is formed over the entire surface of each of the red light emitting layer 33CR, the green light emitting layer 33CG, and the hole transport layer 33B by an evaporation process. Examples of the material to be used for the blue light emitting layer 33CB, which is to be a common layer, may include an anthracene compound as a host material doped with a blue or green fluorescent dye as a guest material. Consequently, blue or green emission light is generated.

Subsequently, the electron transport layer 33D, the electron injection layer 33E, and the upper electrode 34 are formed in this order by an evaporation process on the red light emitting layer 33CR, the green light emitting layer 33CG, and the blue light emitting layer 33CB (FIG. 9), or over the entire surface of the blue light emitting layer 33CB (FIG. 10).

The electron transport layer 33D improves electron transport efficiency to each of the red light emitting layer 33CR, the green light emitting layer 33CG, and the blue light emitting layer 33CB. Examples of the material of the electron transport layer 33D may include quinoline, perylene, phenanthroline, bisstyryl, pyrazine, triazole, oxazole, fullerene, oxadiazole, fluorenone, any derivative thereof, and metal complexes thereof. Specific examples of the material may include tris(8-hydroxyquinoline) aluminum (often abbreviated as Alq3), anthracene, naphthalene, phenanthrene, pyrene, perylene, butadiene, coumarin, $C_{60}$, acridine, stilbene, 1,10-phenanthroline, any derivative thereof, and metal complexes thereof.

The electron injection layer 33E improves electron injection efficiency. Examples of the material of the electron injection layer 33E may include lithium oxide ($Li_2O$) being an oxide of lithium (Li), cesium carbonate ($Cs_2CO_3$) being a complex oxide of cesium (Cs), and mixtures thereof. Examples of the material to be used for the electron injection layer 33E may further include simple substances of metals having a small work function such as alkaline earth metals including calcium (Ca) and barium (Ba), alkali metals such as lithium and cesium, indium (In), and magnesium (Mg), and any alloy thereof. Furthermore, the material may include simple substances of oxides, composite oxides, and fluorides of the metals, and mixtures thereof.

(Step of Forming Upper Electrode)

Subsequently, the upper electrode 34 is formed on the electron injection layer 33E (step S105). The upper electrode 34 is formed into a solid film on the substrate 3 while being isolated from the lower electrode 31 by the bank 32 and the organic layer 14, and serves as an electrode common to the red light emitting element 10R, the green light emitting element 10G, and the blue light emitting element 10B. The upper electrode 34 may be formed of a conductive metal film of, for example, Al, magnesium (Mg), calcium (Ca), or sodium (Na). The upper electrode 34 is preferably formed of an alloy of Mg and Ag (Mg—Ag alloy) that has excellent conductivity in a thin film and is small in light absorbance. The ratio of Mg to silver of the Mg—Ag alloy is preferably, but not limitedly, within a range of a thickness ratio of Mg/Ag=20/1 to 1/1. An alloy (Al—Li alloy) of Al and lithium (Li) may be used as a material of the upper electrode 34.

The upper electrode 34 may be formed of a mixed layer containing an organic luminescent material such as an aluminum quinoline complex, a styryl amine derivative, or a phthalocyanine derivative. In this case, a light-transmissive layer such as Mg—Ag alloy may be further formed as a third layer.

After the upper electrode 34 is formed, a protective layer 35 configured of amorphous silicon nitride having a low water permeability is formed by an evaporation process or a CVD process, for example. After the protective layer 35 is formed, a sealing substrate 6, on which a shielding film and an undepicted color filter are provided, is bonded onto the protective layer 35 with an undepicted adhesive layer in between. This is the end of manufacturing of the display unit 5 (5A or 5B) illustrated in FIGS. 9 and 10.

In the display unit 5, a scan signal is supplied from the scan line drive circuit 130 to each pixel via the gate electrode of the write transistor Tr2, and an image signal is supplied from the signal line drive circuit 120 to a holding capacitance Cs via the write transistor Tr2. Specifically, the drive transistor Tr1 is controlled to be ON or OFF in accordance with a signal held in the holding capacitance Cs, thereby a drive current Id is injected into each of the red light emitting element 10R, the green light emitting element 10G, and the blue light emitting element 10B, and holes and electrons are recombined with each other, resulting in light emission. The light is extracted through the lower electrode 31 and the substrate 3 in the case of bottom emission, while being extracted through the upper electrode 34, a wavelength conversion section, and the sealing substrate 35 in the case of top emission.

(1-4. Functions and Effects)

In a typical printing process, for example, pattern formation is performed as follows. First, a printing plate for planographic printing, intaglio printing, or letterpress printing is produced in accordance with a patterning image, and an appropriate amount of ink is deposited onto an ink reception section in a surface of the printing plate with a die coater, a roller, or the like. Subsequently, the pattern is transferred to a rubber blanket having a surface formed of, for example, chlororubber. The transferred pattern is further transferred (printed) to a printing substrate, thereby the pattern is formed on the printing substrate.

In the process as described above, many rollers are used for supplying ink onto the plate, and the ink is transferred while being kneaded between the rollers. At this time, a phenomenon so-called stringing occurs on a surface of the ink being transferred between the rollers, the stringing being caused by vaporization of a solvent or aging of a binder resin of the ink, or the like. In addition, unevenness in thickness (so-called melon pattern) occurs in the ink on the roller, causing reduction in quality of an image produced by the display unit.

The plate printing process such as the above-described reverse offset printing has been developed as a method of suppressing occurrence of the stringing phenomenon and the melon pattern. In the plate printing, after the ink layer is formed on the blanket, the ink layer is made into contact with a letterpress plate (removal plate) having a convex portion having a pattern reverse to a desired pattern, and a pattern left on the blanket is contact-transferred from the blanket to a printing substrate, so that printing is performed. The blanket is necessary to have releasability that allows the entire contact surface to be transferred when the ink layer formed on the blanket contacts with the printing substrate. Examples of the highly releasable material may include silicone rubber typically based on polydimethylsiloxane.

However, a coated surface of the blanket formed of silicone rubber or the like is small in surface free energy, and is low in wettability by ink. As a result, the ink easily becomes uneven in thickness, and it has been difficult to produce a high-quality print that is high in resolution, and high in image reproducibility. Furthermore, a soft material such as silicone rubber easily absorbs the solvent of the ink solution, and therefore the ink layer applied on the blanket is easily dried. Hence, stringing may occur in an edge of the pattern as described above, or the ink layer is changed into a film, and consequently pattern accuracy may be reduced, or patterning may be prevented.

To overcome such a disadvantage, there have been proposed an approach of beforehand adding a step of swelling the blanket 1 and an approach of adding a step of removing a solvent. However, such approaches each disadvantageously lead to a complicated process and increase in cost. If a phenomenon of incomplete removal of the solvent further occurs, a back diffusion phenomenon occurs, i.e., the solvent is diffused back to the patterned organic matter on the blanket 1; hence, the pattern is contracted during a drying step. As a result, dimension change occurs, leading to reduction in resolution, uneven display luminance of the display unit, and the like. In addition, repeated swelling and contraction accelerates degradation in silicone component, and reduces blanket life.

On the other hand, an approach of using an aqueous ink is proposed from the fact that silicone rubber does not absorb water, and from the viewpoint of workability and the environmental load. In the case of using the aqueous ink, wettability of the coated surface of the blanket is necessary to be improved. In some approach, a surfactant is added to decrease surface tension of the aqueous ink to be used, or a surface of the blanket is plasma-treated so as to be modified. However, if the surfactant is added, the ink solution is foamed by the surfactant. This disadvantageously causes formation of pinholes or the like in the ink layer, reduction in transferability of the ink layer to the printing substrate due to influence of the added surfactant, degradation in function of the functional material, and the like. Moreover, although wettability is improved through modification of the coated surface by plasma treatment, separability as a feature of the silicone blanket is disadvantageously degraded thereby. Furthermore, since surface modification is, in other words, surface alteration, degradation in blanket disadvantageously becomes faster.

In contrast, in this embodiment, the blanket 1 having the sacrificial layer 12 is provided, the sacrificial layer 12 being separably provided on the base 11 configured of silicone rubber or the like, and the ink layer A is provided on the sacrificial layer 12. This allows the ink layer A to be separated from the base 11 together with the sacrificial layer 12 and transferred to the substrate 3. Specifically, this eliminates swelling of the blanket 1 by the organic solvent or surface treatment of the blanket 1 by plasma treatment or the like, which are each a cause of degradation of the blanket 1, and eliminates complicated operation such as adjustment of the ink solution (solution Dr2), such as addition of a surfactant.

As described above, according to the blanket and the printing process of the example embodiment of the present technology, the blanket 1 having the sacrificial layer 12, which is separable from the base 11 in printing, is provided, and printing is performed using the blanket 1. This makes it possible to perform printing onto the streak section A' of the substrate 3 without swelling of the blanket 1 by an organic solvent, or surface treatment of the blanket 1 through plasma treatment or the like as a cause of degradation in blanket 1, and without complicated operation such as adjustment of the ink solution (solution Dr2). In other words, this increases the degree of freedom of selection of the solvent to be used for the ink solution, and achieves high-quality patterning.

As described above, when an ink layer to be, for example, a light emitting layer of an organic EL display unit is directly formed on the blanket having a coated surface of silicone rubber, low-molecular siloxane contained in the silicone rubber is eluted, and the low-molecular siloxane may be mixed into an interface between the light emitting layer and, for example, the electron transport layer. The low-molecular siloxane interferes with charge transport to the light emitting layer, causing degradation in properties such as luminous efficiency. In the blanket 1 of this embodiment, the sacrificial layer 12 is provided between the silicone rubber (base 11) containing the low-molecular siloxane and the ink layer A, which suppresses mixing of the low-molecular siloxane into the ink layer A. Consequently, it is possible to provide a high-grade display unit and a high-grade electronic apparatus.

Furthermore, since the ink layer A (streak section A') is transferred from the blanket 1 to the substrate 3 while having the sacrificial layer 12 (sacrificial layer 12'), the residue of the ink layer is not left on the blanket 1. In other words, the blanket 1 is easily cleaned.

Although this embodiment has been described with an exemplary case where the printing process using the blanket 1 is applied only to the light emitting layer 33C, this is not limitative. The printing process is applicable to formation of other layers, i.e., layers of the thin film transistor configuring the semiconductor layer 20, other wirings, a layer other than the light emitting layer 33C in the organic layer 33, or a patterned layer such as a color filter.

[2. Modification]

Figure 11:
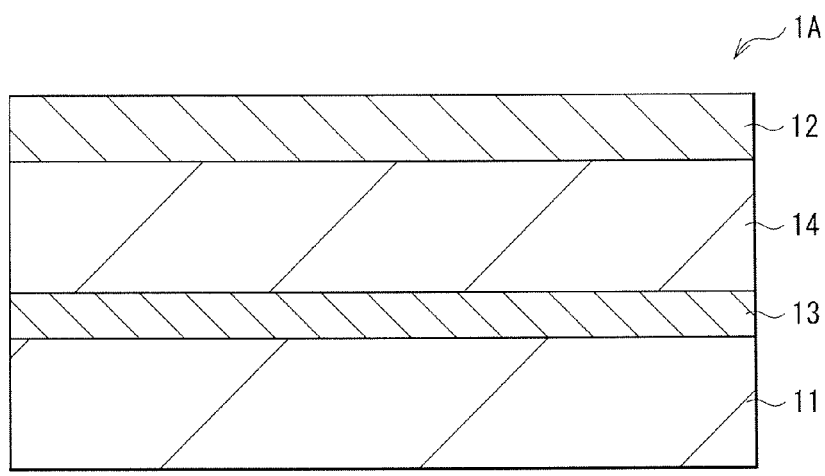
FIG. 11 is a cross-sectional diagram illustrating a configuration of a blanket according to a modification of the present disclosure.

FIG. 11 illustrates a cross-sectional configuration of a blanket (blanket 1A) according to a modification of the above-described embodiment. The blanket 1A is different from the above-described embodiment in that a compression layer 13 and a peeling layer 14 are provided between the base 11 and the sacrificial layer 12.

As with the above-described embodiment, the base 11 may be formed of, for example, a silicone-based material. In addition, in this modification, since the peeling layer 14 for improving separation of the sacrificial layer 12, on which the ink layer A is provided, is provided between the compression layer 13 and the sacrificial layer 12, the base 11 may be formed of a material other than a separable material. Specific examples of the material to be used may include a resin film such as polyethylene terephthalate, polyimide, polypropylene, and polycarbonate, a metal film such as stainless steel, a cloth configured of any of various fibers, a nonwoven fabric, rubber, and the like.

In the case where a solvent of the solution Dr2 containing the functional material is a material similar to that in the above-described embodiment, i.e., water, the sacrificial layer 12 is preferably formed of a material that is soluble in alcohol series solvents and other organic solvents. In the case where the solvent of the solution Dr2 is an aromatic solvent such as toluene, xylene, or mesitylene, the sacrificial layer 12 is preferably formed of a material that is soluble in water.

The compression layer 13 may be formed of an elastic material, for example, foam, rubber, or the like. Specific examples of the material to be used may include polyurethane, polyethylene, and the like.

The peeling layer 14 may be formed of a releasable material, for example, a material having low surface tension, and is preferably formed of a silicone-based material used as the base 11 in the above-described embodiment. Specific examples of the silicone-based material may include silicon resin such as thermosetting millable silicone rubber, addition-type liquid silicone rubber, and condensation curing liquid silicone rubber.

Thus, in this modification, the elastic compression layer 13 is provided in the stacked structure configuring the blanket 1A, thereby it is possible to allow the blanket 1A to be more softly into contact with the substrate 3 in printing. Consequently, further high-definition printing is achieved.

Although the compression layer 13 is provided between the base 11 and the sacrificial layer 12 in this modification, the compression layer 13 may be provided on, for example, on a back side, i.e., on a side opposite to the sacrificial layer 12 of the base 11. The base 11 may further serve as the compression layer 13. Furthermore, the peeling layer 14 may further serve as the compression layer 13.

[3. Example]

Specific Example of the present disclosure is now described.

(Experiment 1)

The blanket 1 described in above-described embodiment was produced, and wiring were formed. First, a stainless steel film was prepared as the base 11, and an adhesive was applied onto the stainless steel film. Subsequently, a layer was formed by a knife coater using one-component condensed liquid silicone rubber, and was left at 25° for a week to cure the silicone rubber, thereby the peeling layer 14 was formed. Subsequently, an isopropyl alcohol solution, in which a polyvinyl butyral resin was dissolved, was applied as the solution D1r onto the peeling layer 14 to form the sacrificial layer 12, so that the blanket 1 was produced (experimental example 1-1).

Subsequently, a conductive composite, in which silver nanoparticles (average particle diameter 10 nm) subjected to surface treatment with oleic acid were dispersed in cyclohexane into a ratio of 5 wt %, was applied as the solution D2r onto the sacrificial layer 12, so that the ink layer A was formed. Subsequently, a removal plate 2 including glass, of which the surface had an irregularity of L/S=5/5 μm (aspect ratio 1:1), was formed, and the removal plate was allowed to contact with the ink layer A to remove a non-pixel section A", so that the streak section A' having a desired pattern and the sacrificial layer 12' were formed on the blanket 1.

Subsequently, the streak section A' was transferred to the substrate 3. Subsequently, the substrate 3 was baked and then immersed in isopropyl alcohol, thereby the sacrificial layer 12' on the streak section A' was solubly removed. Through such operation, a conductive wiring L/S=5/5 μm was formed on the substrate 3. This printing step was repeated N times.

In addition to the experimental example 1-1, as a comparative example, the wiring L/S=5/5 μm was transferred to the substrate 3 under each of the following conditions without providing the sacrificial layer 12. First, in experimental example 1-2, the ink layer A was directly provided on the peeling layer 14. In experimental example 1-3, a surface of the base 11 was subjected to plasma treatment (20 W, 30 sec) in nitrogen gas (0.2 Torr) atmosphere, and then the ink layer A was directly provided on the peeling layer 14. In experimental example 1-4, the base 11 was immersed in octane for 1 hr so as to be sufficiently swollen, and then the ink layer A was directly provided on the peeling layer 14.

Table 2 collectively shows whether each of first printing and nth printing was successful or not in each of the experimental examples 1-1 to 1-4.

TABLE 2

|  | First printing | ... | nth printing |
|---|---|---|---|
| Experimental example 1-1 | Successful |  | 100 times or more |
| Experimental example 1-2 | Not successful |  | Not successful |
| Experimental example 1-3 | Successful |  | 3 times |
| Experimental example 1-4 | Successful |  | 10 times |

As seen in Table 2, the blanket 1 was able to be repeatedly used 100 times or more in experimental example 1-1 where the sacrificial layer 12 was provided. On the other hand, the ink layer A was not able to be uniformly formed on the blanket in experimental example 1-2 where the solution D2r was directly applied on the peeling layer 14. In experimental example 1-3 where the blanket 1 was subjected to plasma treatment, although the ink layer A was able to be uniformly formed on the blanket 1, a crazing called crack occurred in the surface of the blanket 1 after several times (in this case, three times) of use, and a disconnected portion was formed in the printed wiring. Furthermore, in experimental example 1-4 where the blanket 1 was immersed in the solvent so as to be swollen, the surface of the blanket 1 was gradually increased in roughness, and the residue of the ink layer A was seen on the surface of the transferred blanket 1 after ten times of use.

(Experiment 2)

The blanket 1 was produced through a step similar to that in the experiment 1, and a channel layer of a thin film transistor was formed. In this case, the channel layer was formed of an organic material (a dioxaneanthanthrene compound) shown in the following Chemical Formula 1. Since the dioxaneanthanthrene compound is not soluble in ethylene alcohol, an ethylalcohol solution, in which polyamide resin was dissolved, was applied onto the base 11 to form the sacrificial layer 12 (experimental example 2-1).

Chemical Formula 1

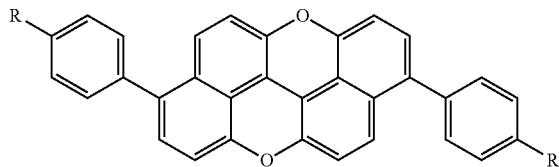

Subsequently, the dioxaneanthanthrene compound was dissolved in xylene into the solution D2r that was then applied onto the sacrificial layer 12 to form the ink layer A. Subsequently, the removal plate 2 having irregularity was allowed to be in contact with the ink layer A to remove the non-pixel section A″, so that the streak section A′ having a desired pattern and the sacrificial layer 12′ were formed on the blanket 1.

Subsequently, the streak section A′ was transferred to the substrate 3. Subsequently, the substrate 3 was baked and then immersed in ethylalcohol; thereby the sacrificial layer 12 was solubly removed. Through such operation, the thin film transistor with the dioxaneanthanthrene compound as the channel layer was produced on the substrate 3. This printing step was repeated N times.

In addition to the experimental example 2-1, as a comparative example, the channel layer was transferred to the substrate 3 under each of the following conditions without providing the sacrificial layer 12. First, in experimental example 2-2, the ink layer A was directly provided on the base 11. In experimental example 2-3, a surface of the base 11 was subjected to plasma treatment (20 W, 30 sec) in nitrogen gas (0.2 Torr) atmosphere, and then the ink layer A was directly provided on the base 11. In experimental example 2-4, the base 11 was immersed in xylene for 1 hr so as to be sufficiently swollen, and then the ink layer A was directly provided on the base 11.

Table 3 collectively shows whether each of first printing and nth printing was successful or not in each of the experimental examples 2-1 to 2-4.

TABLE 3

|  | First printing | ... | nth printing |
|---|---|---|---|
| Experimental example 2-1 | Successful |  | 100 times or more |
| Experimental example 2-2 | Not successful |  | Not successful |
| Experimental example 2-3 | Successful |  | 3 times |
| Experimental example 2-4 | Successful |  | 10 times |

As seen in Table 3, the blanket 1 was able to be repeatedly used 100 times or more in experimental example 2-1 where the sacrificial layer 12 was provided. On the other hand, the ink layer A was not able to be uniformly formed on the blanket in experimental example 2-2 where the solution D2r was directly applied on the peeling layer 14. In experimental example 2-3 where the blanket 1 was subjected to plasma treatment, although the ink layer A was able to be uniformly formed on the blanket 1, a crack occurred in the surface of the blanket 1 after several times (in this case, three times) of use, and a channel layer having a predetermined shape was not able to be formed. Furthermore, in experimental example 2-4 where the blanket 1 was immersed in the solvent so as to be swollen, the surface of the blanket 1 was gradually increased in roughness, and the residue of the ink layer A was seen on the surface of the transferred blanket 1 after ten times of use.

[4. Application Examples]

(Module and Application Examples)

Application examples of the display unit 5 (5A or 5B) described in the above-described embodiment are now described. The display unit according to the above-described embodiment is applicable to display units of electronic apparatuses in various fields, which display externally-input or internally-generated image signals as still or video images, including a television apparatus, a digital camera, a notebook personal computer, a mobile terminal device such as a mobile phone, and a video camcorder.

(Application Example 1)

Figure 12A:
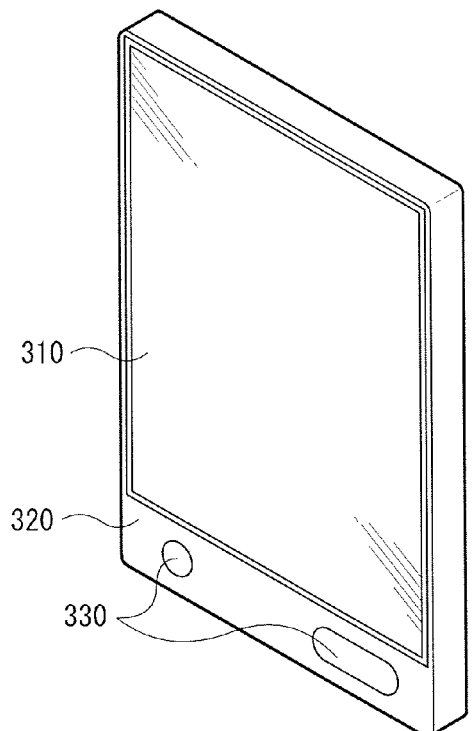
FIG. 12A is a perspective view illustrating appearance of application example 1 of the display unit according to the above-described embodiment as viewed from its front side.
Figure 12B:
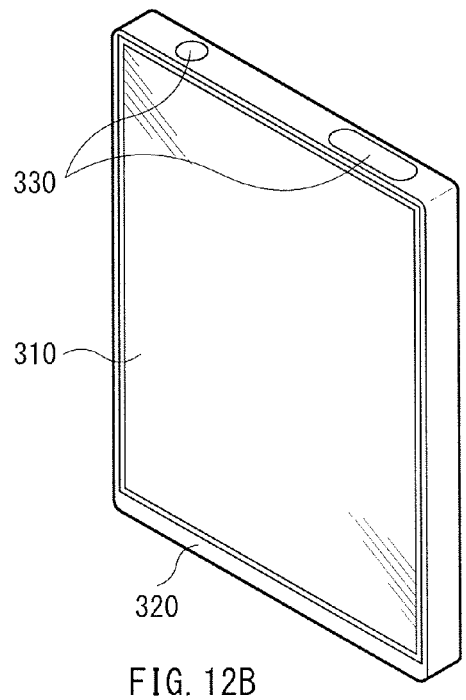
FIG. 12B is a perspective view illustrating appearance of the application example 1 of the display unit using a pixel according to any of the above-described embodiment and a modification thereof as viewed from its back side.

FIGS. 12A and 12B illustrate appearance of a smartphone. This smartphone includes, for example, a display section 310 (display unit 5), a non-display section (housing) 320, and an operational section 330. The operational section 330 may be provided on a front surface or a top surface of the non-display section 320.

(Application Example 2)

Figure 13:
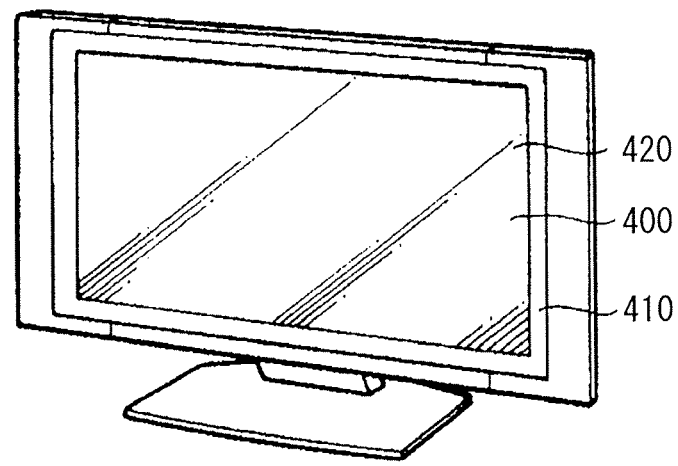
FIG. 13 is a perspective view illustrating appearance of application example 2.

FIG. 13 illustrates an appearance configuration of a television apparatus. This television apparatus includes, for example, an image display screen section 400 (display unit 5) including a front panel 410 and a filter glass 420.

(Application Example 3)

Figure 14A:
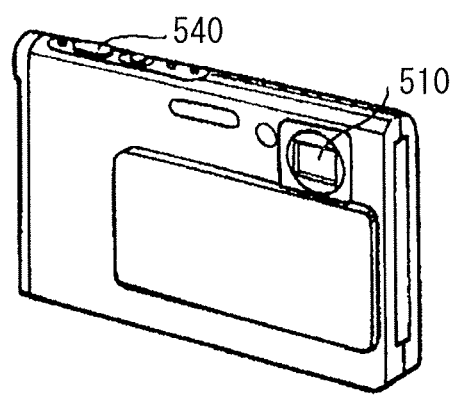
FIG. 14A is a perspective view illustrating appearance of application example 3 as viewed from its front side.
Figure 14B:
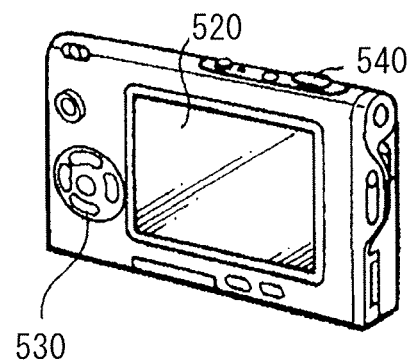
FIG. 14B is a perspective view illustrating appearance of the application example 3 as viewed from its back side.

FIGS. 14A and 14B illustrate an appearance configuration of a digital still camera, showing a front surface and a back surface, respectively, of the digital still camera. This digital still camera includes, for example, a light emitting section 510 for flash, a display section 520 (display unit 5), a menu switch 530, and a shutter button 540.

(Application Example 4)

Figure 15:
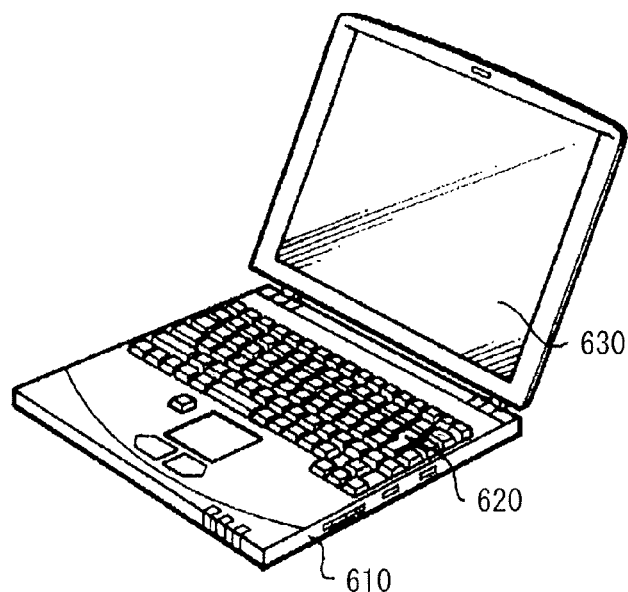
FIG. 15 is a perspective view illustrating appearance of application example 4.

FIG. 15 illustrates an appearance configuration of a notebook personal computer. This notebook personal computer includes, for example, a main body 610, a keyboard 620 for input operation of characters and the like, and a display section 630 (display unit 5) that displays images.

(Application Example 5)

Figure 16:
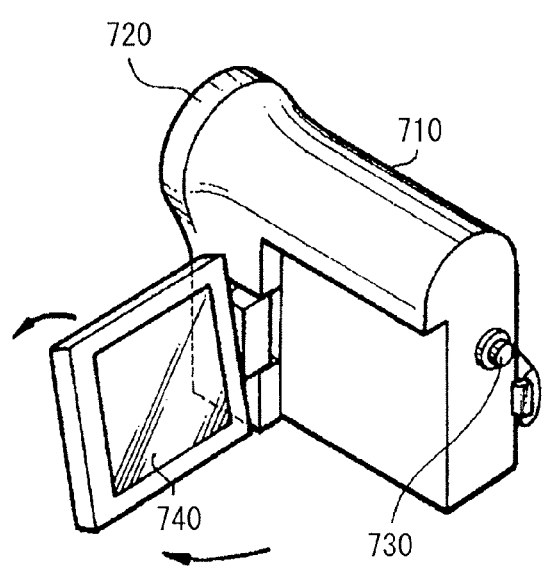
FIG. 16 is a perspective view illustrating appearance of application example 5.

FIG. 16 illustrates an appearance configuration of a video camcorder. This video camcorder includes, for example, a main body section 710, an object-shooting lens 720 provided on a front side face of the main body section 710, a start-and-stop switch 730 for shooting, and a display section 740 (display unit 5).

(Application Example 6)

Figure 17A:
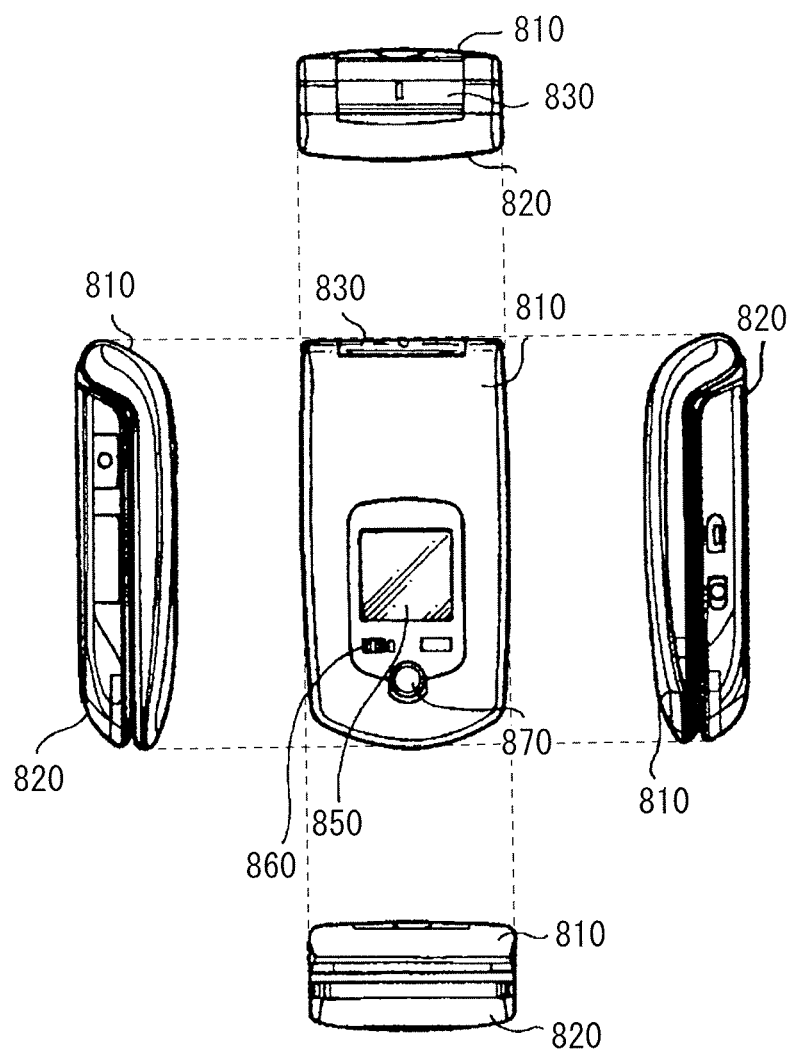
FIG. 17A includes a front view, a left side view, a right side view, a top view, and a bottom view of application example 6 in a closed state.
Figure 17B:
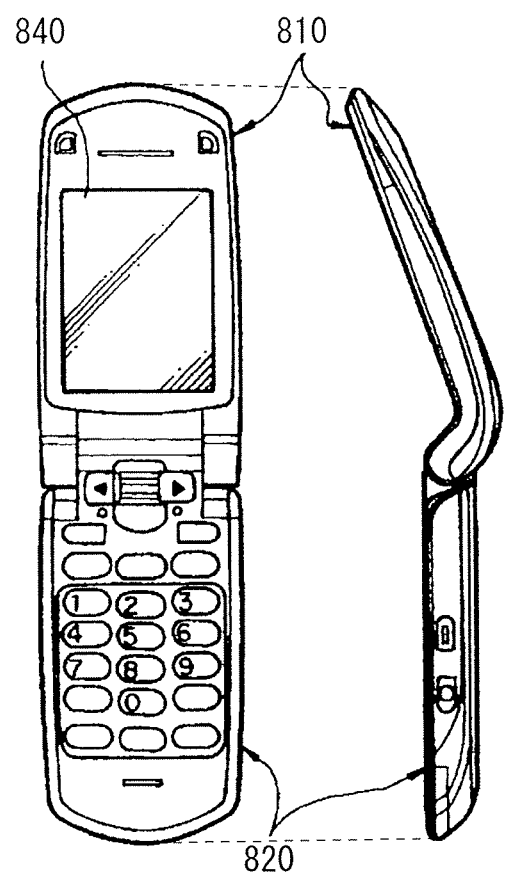
FIG. 17B includes a front view and a side view of the application example 6 in an opened state.

FIGS. 17A and 17B each illustrate appearance configuration of a mobile phone. FIG. 17A includes a front view, a left side view, a right side view, a top view, and a bottom view of the mobile phone in a closed state. FIG. 17B includes a front view and a side view of the mobile phone in an opened state. For example, the mobile phone may be configured of an upper housing 810 and a lower housing 820 connected to each other by a hinge section 830, and may have a display 840 (display unit 5), a sub display 850, a picture light 860, and a camera 870.

Although the present disclosure has been described with the example embodiment, the modification thereof, and the Example hereinbefore, the disclosure is not limited thereto, and various modifications or alterations thereof may be made. For example, although the above-described embodiment, the modification, and the Example have been described with an exemplary case where the solution D2r is used to form the red light emitting layer 33CR or the green light emitting layer 33CG, another organic layer 33 such as the hole injection layer 33A or the hole transport layer 33B may be formed through patterning. In particular, when the hole injection layer 33A is formed through patterning, leakage current is allowed to be suppressed. Moreover, the thin film transistor configuring the semiconductor layer 20 is formed using the plate printing described in the above-described embodiment, the modification, and the Example, thereby use efficiency of each material is improved.

Furthermore, although the above-described embodiment, the modification, and the Example have been described with specific configurations of the light emitting elements 10R, 10G, and 10B, each light emitting element may not include all the layers, or may further include another layer. Moreover, although the above-described embodiment, the modification, and the Example have been described on a display unit including red and green light emitting elements other than the blue light emitting element, the present disclosure is not limited thereto, and is applicable to general display units in which any functional layer is formable by a printing process. For example, the present disclosure may be applicable to a display unit including a blue light emitting element and a yellow light emitting element.

Furthermore, although the above-described embodiment, the modification, and the Example have been described with a case of the active-matrix display unit 5A or 5B, the present disclosure is applicable to a passive-matrix display unit. Furthermore, the configuration of the pixel drive circuit for active matrix drive is not limited to that described in the above-described embodiment, and a capacitive element or a transistor may be added as necessary. In such a case, a necessary drive circuit may be provided in addition to the signal line drive circuit 120 and the scan line drive circuit 130 in accordance with the modified pixel drive circuit.

Furthermore, although the above-described embodiment, the modification, and the Example have been described with a case where the display unit 5A or 5B is of a top emission type, the present disclosure may be applicable to a display unit 5A or 5B of a bottom emission type in which light is extracted from a bottom, or of a type in which light is extracted from both the top and bottom.

It is possible to achieve at least the following configurations from the above-described example embodiments of the disclosure.

(1) A blanket, including:
- a releasable base; and
- a sacrificial layer being provided on the base and separated from the base in printing.

(2) The blanket according to (1), wherein an ink layer containing a functional material is provided by coating on the sacrificial layer, and the sacrificial layer is configured of a material that is insoluble in a solvent contained in the ink layer.

(3) The blanket according to (1) or (2), wherein a solubility parameter of a solvent of a solution forming the sacrificial layer is different by two or more from a solubility parameter of the solvent of a solution forming the ink layer.

(4) The blanket according to any one of (1) to (3), wherein the base is compressible.

(5) The blanket according to any one of (1) to (4), wherein the sacrificial layer is transferred together with the ink layer to a printing substrate.

(6) The blanket according to any one of (1) to (5), wherein the base is configured of silicone resin.

(7) A printing process, including:
- forming a functional ink layer on a blanket having a sacrificial layer on a releasable base, the sacrificial layer being separated from the base in printing;
- pressing a removal plate having a convex portion having a predetermined pattern to the ink layer to form a pattern layer on the blanket; and
- transferring the pattern layer to a printing substrate.

(8) The printing process according to (7), further including removing the sacrificial layer from a surface of the ink layer after transferring the pattern layer to the printing substrate.

(9) The printing process according to (7) or (8), wherein the pattern layer is configured of the ink layer and the sacrificial layer.

(10) The printing process according to any one of (7) to (9), further including forming the sacrificial layer on the base.

(11) A method of manufacturing a display unit, the method including
- forming a display device,
- the forming of the display device including:

forming a functional ink layer on a blanket having a sacrificial layer on a releasable base, the sacrificial layer being separated from the base in printing;

pressing a removal plate having a convex portion having a predetermined pattern to the ink layer to form a pattern layer on the blanket; and transferring the pattern layer to a printing substrate.

(12) The method according to (11), wherein the display device includes: a semiconductor layer having a wiring layer on a substrate, and an organic layer including at least a light emitting layer between a pair of first electrode and a second electrode; and one or both of the wiring layer and the organic layer including the light emitting layer is formed on the releasable base with the blanket having the sacrificial layer that is separated from the base in printing.

(13) A method of manufacturing an electronic apparatus, the method including forming a display unit, the forming of the display unit including:

forming a functional ink layer on a blanket having a sacrificial layer on a releasable base, the sacrificial layer being separated from the base in printing;

pressing a removal plate having a convex portion having a predetermined pattern to the ink layer to form a pattern layer on the blanket; and transferring the pattern layer to a printing substrate.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A printing method comprising:

forming a functional ink layer on a blanket having a sacrificial layer on a base;

pressing a removal plate having a convex portion having a predetermined pattern to the ink layer and removing portions of the sacrificial layer and the ink layer associated with the predetermined pattern to form a pattern layer on the blanket, the pattern layer including remaining portions of the sacrificial layer and the ink layer;

transferring the pattern layer to a printing substrate; and removing the sacrificial layer from a surface of the ink layer after transferring the pattern layer to the printing substrate.

2. The printing method according to claim 1, wherein the pattern layer is configured of the ink layer and the sacrificial layer.

3. The printing method according to claim 1, further comprising forming the sacrificial layer on the base.

4. A method of manufacturing a display unit, the method comprising:

forming a display device by:

forming a functional ink layer on a blanket having a sacrificial layer on a base, pressing a removal plate having a convex portion having a predetermined pattern to the ink layer and removing portions of the sacrificial layer and the ink layer associated with the predetermined pattern to form a pattern layer on the blanket, the pattern layer including remaining portions of the sacrificial layer and the ink layer, transferring the pattern layer to a printing substrate, and removing the sacrificial layer from a surface of the ink layer after transferring the pattern layer to the printing substrate.

5. The method according to claim 4, wherein the display device includes: a semiconductor layer having a wiring layer on a substrate, and an organic layer including at least a light emitting layer between a pair of first electrode and a second electrode; and one or both of the wiring layer and the organic layer including the light emitting layer is formed on the base with the blanket having the sacrificial layer that is separated from the base in printing.

6. A method of manufacturing an electronic apparatus, the method comprising:

forming a display unit by:

forming a functional ink layer on a blanket having a sacrificial layer on a base, pressing a removal plate having a convex portion having a predetermined pattern to the ink layer and removing portions of the sacrificial layer and the ink layer associated with the predetermined pattern to form a pattern layer on the blanket, the pattern layer including remaining portions of the sacrificial layer and the ink layer, transferring the pattern layer to a printing substrate, and removing the sacrificial layer from a surface of the ink layer after transferring the pattern layer to the printing substrate.

* * * * *